(12) United States Patent
Juenemann et al.

(10) Patent No.: US 7,183,877 B2
(45) Date of Patent: Feb. 27, 2007

(54) DIRECTIONAL COUPLER IN COPLANAR WAVEGUIDE TECHNOLOGY

(75) Inventors: Ralf Juenemann, Munich (DE); Wolfgang Cohrs, Poing (DE); Juergen Thies, Unterhaching (DE); Gerd Hechtfischer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 217 days.

(21) Appl. No.: 10/799,347

(22) Filed: Mar. 12, 2004

(65) Prior Publication Data

US 2004/0233014 A1    Nov. 25, 2004

(30) Foreign Application Priority Data

Apr. 8, 2003    (DE) ............................... 103 16 047

(51) Int. Cl.
*H01P 5/12* (2006.01)
*H01P 3/08* (2006.01)

(52) U.S. Cl. ..................... 333/116; 333/109
(58) Field of Classification Search ............... 333/116, 333/123, 128, 33; 324/158.1; 437/63
See application file for complete search history.

(56) References Cited

U.S. PATENT DOCUMENTS

| | | | | |
|---|---|---|---|---|
| 4,313,095 A | * | 1/1982 | Jean-Frederic | 333/116 |
| 4,677,399 A | * | 6/1987 | Le Dain et al. | 333/116 |
| 4,732,445 A | * | 3/1988 | Sabatier et al. | 385/41 |
| 4,843,027 A | * | 6/1989 | Geekie | 438/10 |
| 5,097,233 A | * | 3/1992 | Pekarek | 333/116 |
| 5,187,447 A | * | 2/1993 | Tsai | 330/124 R |
| 6,734,755 B2 | * | 5/2004 | Cites et al. | 333/33 |
| 6,753,679 B1 | * | 6/2004 | Kwong et al. | 324/158.1 |

FOREIGN PATENT DOCUMENTS

| | | |
|---|---|---|
| JP | 61274401 A | 12/1986 |
| JP | 07283621 A | 10/1995 |
| WO | WO 03/009414 A1 | 1/2003 |

\* cited by examiner

*Primary Examiner*—Dean Takaoka
(74) *Attorney, Agent, or Firm*—Christensen O'Connor Johnson Kindness PLLC

(57) ABSTRACT

The directional coupler (1) in coplanar waveguide technology comprises at least one first directional coupler unit (100) with a first connection (103) for feeding in or guiding out a wave, a second connection (104) for feeding in or guiding out a wave supplied directly from or to the first connection (103), a coupled connection (106) for coupling a fraction of a feeded wave at connection (103)and a termination (105). The first connection (103) is connected to the second connection (104) via a first center conductor (107). The coupled connection (106) is connected to the termination (105) via a second center conductor (108). The center conductors (107, 108) are bordered on the outside by ground conductors (110,112). The spacing between the center conductor (107) and its adjacent ground conductor (110) and/or between the center conductor (108) and its adjacent ground conductor (112) and the spacing between the two center conductors (107,108) as well as the width of the conductor track of the two center conductors (107,108) change along the longitudinal extension of the center conductors (107,108).

24 Claims, 7 Drawing Sheets

Odd-Mode

Even-Mode

DIRECTIONAL COUPLER IN COPLANAR WAVEGUIDE TECHNOLOGY

FIELD OF THE INVENTION

The invention relates to a directional coupler in coplanar waveguide technology.

BACKGROUND OF THE INVENTION

Directional couplers are used very extensively in technical circuit applications. They are used in phase modifiers, mixers and amplifiers as direction-dependent, de-coupled power dividers. In the field of measurement technology, directional couplers are used for separate measurement of outward and returning waves to and from a device under test (DUT), for example, in the case of network analysers.

In order to realise a coupler with good high-frequency properties in a comparatively compact design with favourable manufacturing costs, directional couplers are preferably manufactured using a monolithically integrated design. Alongside the conventional microstripline technology, directional couplers can also be realised in coplanar technology with a monolithically integrated design. The advantage of a directional coupler in coplanar technology in comparison with a realisation using microstripline technology can be seen, on the one hand, in the attachment of all lines (center conductors, ground conductors) on one side of the substrate. Accordingly, boreholes and through contacts in the substrate, which are necessary for the additional connection of components (e.g. capacitors, inductors) in the microwave circuit are not needed. A further quite substantial advantage of a directional coupler in coplanar technology, by comparison with a realisation in microstripline technology, is that the phase velocity of the even-mode $v^{(e)}$ can be designed to be approximately equal to the phase velocity of the odd-mode $v^{(o)}$, so that the directional loss (directivity) $a_D$ can be maximised. This is shown schematically in FIG. 1, the values indicated being provided merely as examples. With a high directivity $a_D$, the power of a wave coupled into the coupling pathway is significantly higher by comparison with the power of a wave coupled to the isolation pathway of a directional coupler. In this context, FIG. 2 presents schematically the basic method of functioning and circuitry for a directional coupler.

EP 0 511 728 B1 discloses a directional coupler in coplanar technology. In the context of directional couplers in coplanar technology realised at the time of publication of this document, the coupling factor was comparatively low, because the distance between the center conductors of an integrated microwave circuit participating in the coupling could not be designed as small as was desirable for reasons of manufacturing technology. Accordingly, the inter-digital coupler (Lange-coupler) presented in EP 511 728 B1 provides a significantly higher coupling factor. This is achieved by means of parallel connection of several center conductors on the substrate. The disadvantage with this coplanar design of the directional coupler is its small band width.

The present invention is therefore based on the object of realising an ultra-broadband directional coupler in coplanar technology as required in measuring technology and particularly in network analysis.

The object of the invention is achieved by a directional coupler in coplanar waveguide technology corresponding to the features of the independent claims 1, 3 and 7.

Advantageous embodiments of the invention are indicated in the dependent claims.

SUMMARY OF THE INVENTION

In order to keep the coupling loss $a_k$ ($a_k=-20*\log(k)$ where $k=|b_2/a_1|$ approximately constant over a relatively large frequency range (broad-band coupler), several coupler segments of different coupling loss are connected one after the other. In the initial planning stage for the directional coupler, a total of, for example, 40 coupler segments of the same length were defined for this purpose, within which the spacing between the two center conductors and, in each case, between one center conductor and one ground conductor is kept constant, while these spacings vary in different coupler segments in order to realise a different coupling coefficient. To achieve a continuous change of the coupling coefficient along the longitudinal direction of the individual conductors, the step-shaped characteristic of the center conductors and ground conductors and/or of the associated gaps was interpolated in a second planning stage with linear characteristics and/or cubic spline-function characteristics.

By superimposing the individual phase constants and/or velocities of even-mode and odd-mode in the individual coupler segments, a resulting phase constant and/or velocity of even-mode and odd-mode occurs in the individual coupler segments. These resulting phase constants and/or velocities of even-mode and odd-mode can be adjusted independently of one another, because, by determining the gap geometry between the center conductor and the ground conductor and the gap geometry between the center conductors in all coupler segments, multiple degrees of calculation freedom are provided for the almost independent determination of these parameters over the entire course of the center conductors and ground conductors.

DESCRIPTION OF THE DRAWINGS

An exemplary embodiment of the invention is presented in the drawings and will be described in greater detail below. The drawings are as follows.

DETAILED DESCRIPTION

The directional coupler in coplanar waveguide technology according to the invention will be described below with reference to FIGS. 3 to 7.

Figure 3:
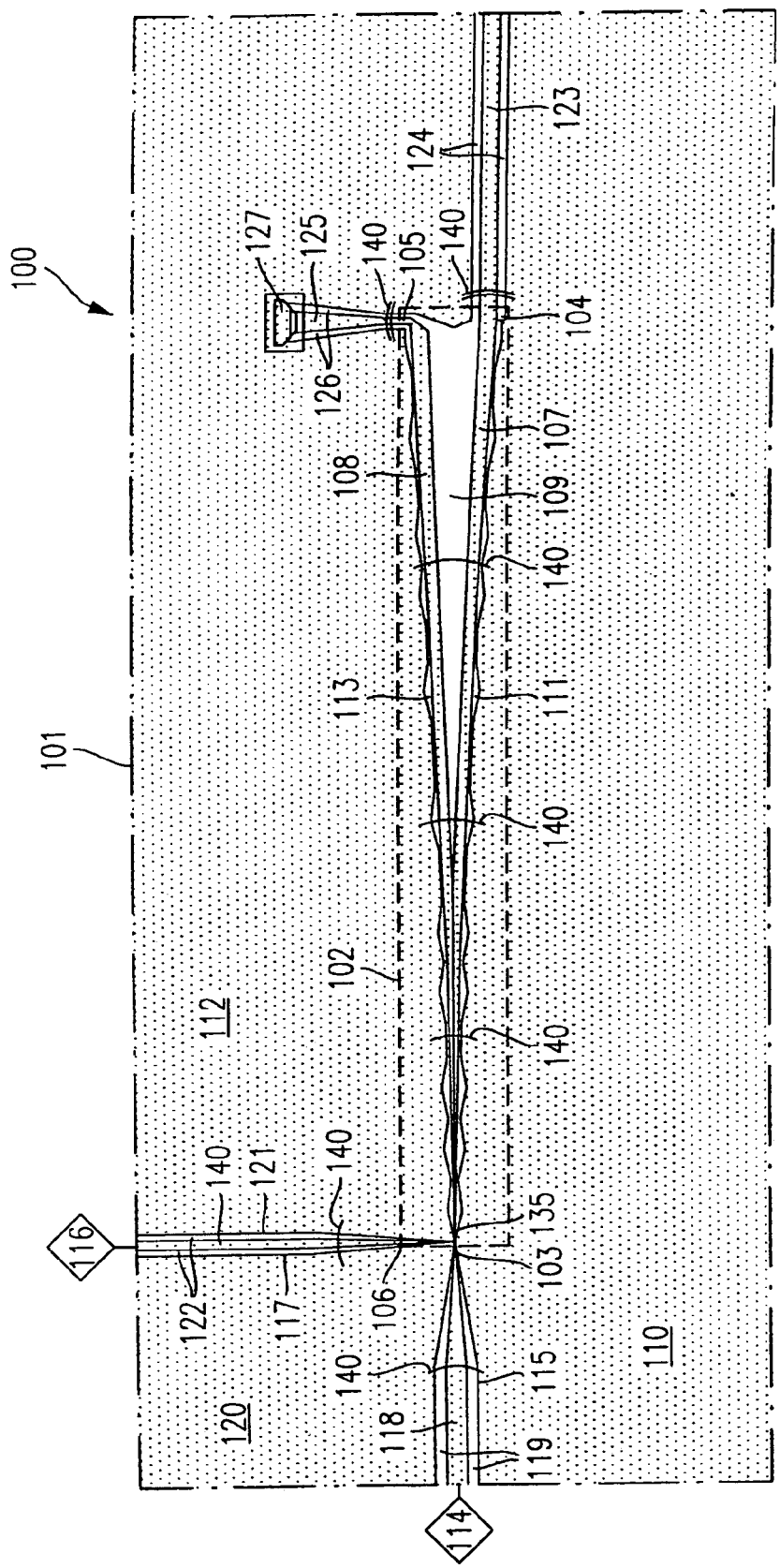
FIG. 3 shows a topology for a directional coupler unit in a directional coupler according to the invention in coplanar waveguide technology, as a detail III of FIG. 4.

FIG. 3 illustrates a directional coupler unit 100 of a directional coupler 1 in coplanar waveguide technology according to the invention. The directional coupler unit 100 is realised on a substrate 101 made, for example, from an aluminium-oxide ceramic. On the substrate 101, the directional coupler unit 100 provides a coupler section 102 with a first connection 103 for feeding in and guiding out an electromagnetic wave, a second connection 104 for feeding in and guiding out an electromagnetic wave, a coupled connection 106 for coupling an electromagnetic wave and a termination 105.

The first connection 103 is connected to the second connection 104 via a first center conductor 107. The coupled connection 106 is connected to the termination 105 via a second center conductor 108, which runs along the coupler section 102 essentially parallel to the first center conductor 107. Between the first center conductor 107 and the second center conductor 108, a gap 109 is provided. This gap 109 increases exponentially from the first connection 103 and/or the coupling connection 106 in the direction towards the second connection 104 and/or the termination 105.

In order to optimise the coupler section 102, the coupler section can be subdivided into 40 coupler segments of equal length. Accordingly, the center conductors 107 and 108, the associated ground conductors 110 and 112, the gap 111 disposed between the first center conductor 107 and the adjacent, large-surface ground conductor 110, the gap 113 disposed between the second center conductor 108 and the associated large-surface ground conductor 112 and the gap 109 disposed between the first and second center conductors 107 and 108 are also subdivided into 40 segments of equal length, which will be referred to below as coupler segments.

With an optimisation in the first design stage, the widths $g_i$ of the gaps 111 and 113, the widths $w_i$ of the center conductors 107 and 108, and the widths of the gaps $s_i$ between the center conductors 107 and 108 are calculated in the individual coupler segments i. In this context, the boundary conditions defined in formula (1) apply for $g_i$.

$$g_{min} \leq g_i \leq g_{max} \tag{1}$$

In this context, the lower limit value $g_{min}$ is defined by the structural widths realisable with thin-layer technology.

The upper limit value $g_{max}$ is a value selected to be geometrically meaningful.

The characteristics of the gap widths $g_i$ of the gaps 111 and 113 are initially approximated through step functions by means of simulation-supported optimisation. In a further design stage, the "step-midpoints" for this step function can be subjected to a linear interpolation, forming a "zig-zag" characteristic of the gaps 111 and 113 in the longitudinal direction of the center conductors 107 and 108.

Moreover, the two center conductors 107 and 108 are preferably tapered in a linear manner with reference to the width of the conductor track. Accordingly, from the connections 103 and/or 106 in the direction towards the connections 104 and/or 105, they provide a linear increase in the width of their conductor track. Within the framework of the simulation model for optimising the coupler section 102 with a total of 40 coupler segments, the optimisation formula (2) can be used for calculating the width $w_i$ of the conductor track in coupler segment i, where $w_0$ and $w_1$ are freely selectable constants within certain limits (e.g. structural accuracy).

$$W_{i=w_0} + 0.004*(i-1)*w_1 \tag{2}$$

Also, in calculating the characteristic for the width of the conductor track of the center conductors 107 and 108, on the basis of the step function for the width $w_i$ of the conductor track determined through the optimisation formula (2), the "step-midpoints" for this step function can be subjected to a linear interpolation in a further design stage.

Finally, the width $s_i$ of the gap 109 in the coupler segment i is determined using the formula (3), where $s_o$, and $s_k$ are constants freely selectable and optimisable within certain limits.

$$S_i = s_0 + \sum_{k=2}^{2n} s_k * i^k \tag{3}$$

The result of this optimisation calculation is a step-shaped approximately exponential characteristic for the gap width from connections 103 and/or 106 towards connections 104 and/or 105.

The first connection 103 is connected via a taper 115 to a first external connection 114 provided at the edge of the directional coupler unit 100. Similarly, the coupled connection 106 is connected via a taper 117 to a second external connection 116. Coaxial lines can be connected to the first and second external connections 114 and 116 via corresponding plug connections, which are not shown in FIG. 3.

The taper 115 consists of a center conductor 118, which is placed on the substrate 101 and is separated via gaps 119 on both sides from the large-surface ground conductors 110 and 120. The width of the center conductor 108 is constant in the region of the first external connection 114 and narrows in the region of the first connection 103 to the width of the center conductor 107 in the first coupler segment. In this manner, the field characteristic of the coaxial line is continuously adapted to the field characteristic of the coplanar waveguide system on the substrate 101, while retaining the conventional characteristic impedance of 50 ohms.

As with the taper 115, the taper 117 consists of a center conductor 121, which is placed on the substrate 101 and separated via gaps 122 on both sides from the large-surface ground conductors 112 and 120. The width of the center conductor 121 is constant in the region of the second external connection 116 and narrows in the region of the coupled connection 106 towards the width of the center conductor 108 in the first coupler segment.

Figure 4:
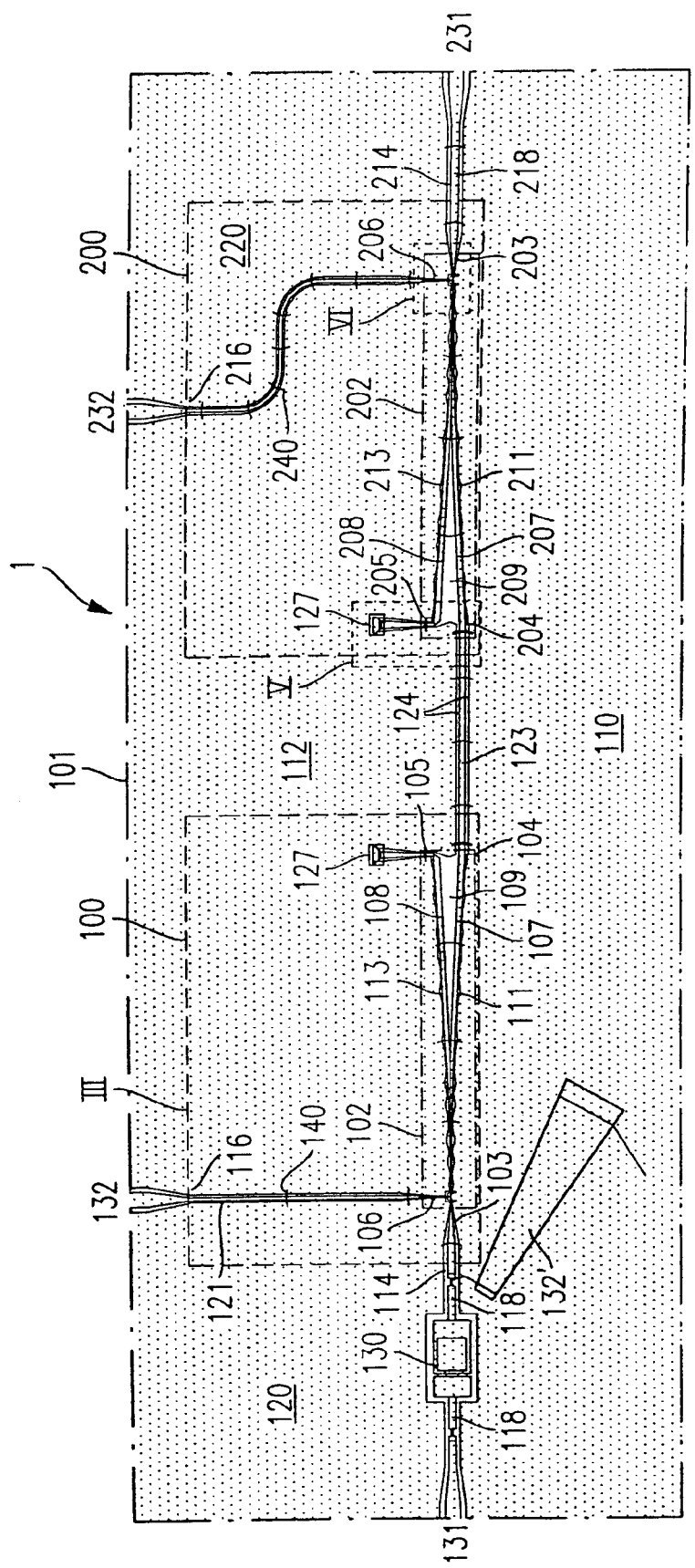
FIG. 4 shows a complete view of a topology for the directional coupler according to the invention in coplanar waveguide technology.

In the exemplary embodiment presented in FIG. 4, two directional coupler units 100 and 200 are provided. However, this is not compulsory within the framework of the present invention.

The second connection 104 is connected to the first connection 204 of a second directional coupler unit 200, which is placed on the same substrate 101 of the directional coupler 1. This connection is made via a center conductor 123, which provides the same width over the entire course of the connection as the center conductor 107 connected to it shows at the terminating coupler segment. The center conductor 123 is limited from the adjacent ground conductors 110 and 112 via gaps 124, which provide the same width over the entire course of the connection.

The termination 105 is connected, via a center conductor 125, in which the width of the conductor track increases, and via the adjacent gaps 126, which seperate the center conductor 125 from the ground conductor 112 adjacent on both sides, to an absorber 127, which is designed in the exemplary embodiment in a trapezoidal shape. This trapezoidal absorber 127 may, for example, consist of nickel-chrome and forms a trimmable precision-impedance termination. This guarantees an almost completely reflection-free termination at the termination 105. The precision absorber 127 is symmetrical relative to the center conductor 125 and the ground conductor 112 on both sides because of its trapezoidal shape. By means of symmetrical removal of the absorber 127, for example, by means of laser, the termination impedance can be trimmed with great accuracy to 50 ohms between the center conductor 125 and the ground conductor 112 on both sides.

FIG. 4 shows the topology of the entire directional coupler 1 in coplanar waveguide technology. It consists of the directional coupler unit 100 presented in FIG. 3 and the other directional coupler unit 200. The directional coupler unit 200 provides the same structure with the same components as the directional coupler unit 100. Its topological orientation on the substrate 101, however, is in mirror image to the topological orientation of the directional coupler unit 100. The reference numbers for the components of the directional coupler unit 200 are therefore derived from the reference numbers of the corresponding components in directional coupler unit 100, the initial digit "1" of the reference number being replaced by a "2".

In the directional coupler 1 shown in FIG. 4 on the substrate 101, the first external connection 114 of the directional coupler unit 1, corresponding to FIG. 3, is connected via a capacitor 130, which is also attached to the substrate 101, to the first external connection 131 of the directional coupler 1. The first external connection 131 is used for feeding in and guiding out an electromagnetic wave. The object of the capacitor 103 is the galvanic direct-current decoupling of the first external connection 131. A direct-current component, superimposed over the microwave component of the electromagnetic wave fed in at the first external connection 131 can be supplied via the inductor 132'.

In the directional coupler 1 shown in FIG. 4 on the substrate 101, the second external connection 116 of the directional coupler unit 100 corresponding to FIG. 3 is connected to a second external connection 132. The second external connection 132 provides a fraction of the electromagnetic wave fed into the directional coupler unit 100 at the external connection 131.

In the directional coupler 1 shown in FIG. 4 on the substrate 101, the first external connection 214 of the directional coupler unit 200 in FIG. 3 is connected to a fourth external connection 231. The fourth external connection 231 is used for feeding in and guiding out an electromagnetic wave.

Similarly, the second external connection 216 of the directional coupler unit 200 in the directional coupler 1 on the substrate 101 is connected to a third external connection 232. The third external connection 232 provides a fraction of the electromagnetic wave fed into the directional coupler unit 200 at the external connection 231.

If the directional coupler 1 is connected between a device under test (DUT) and a network analyser, then the high-frequency electromagnetic wave will be fed in at the first external connection 131 in order to excite the device to be tested by the network analyser, for example, in order to measure the S-parameters of the device under test. The high-frequency electromagnetic wave which was fed in at the first external connection 131 and transferred via the two directional coupler units 100 and 200 directly to the fourth external connection 231, is guided out at the fourth external connection 231, which is connected to the device under test. At the same time, the electromagnetic wave reflected from the device under test is fed in at the fourth external connection 231. The electromagnetic wave fed in at the first external connection 131 and coupled at the coupled connection 106 of the first directional coupler unit 100 is guided to the second external connection 132. The electromagnetic wave reflected from the device under test into directional coupler 1 and coupled at the coupled connection 206 of the second directional coupler unit 200, is guided to the fourth external connection 232. If the device under test provides several measuring ports, then a directional coupler 1 according to the invention should be provided at each measuring port.

Figure 5:
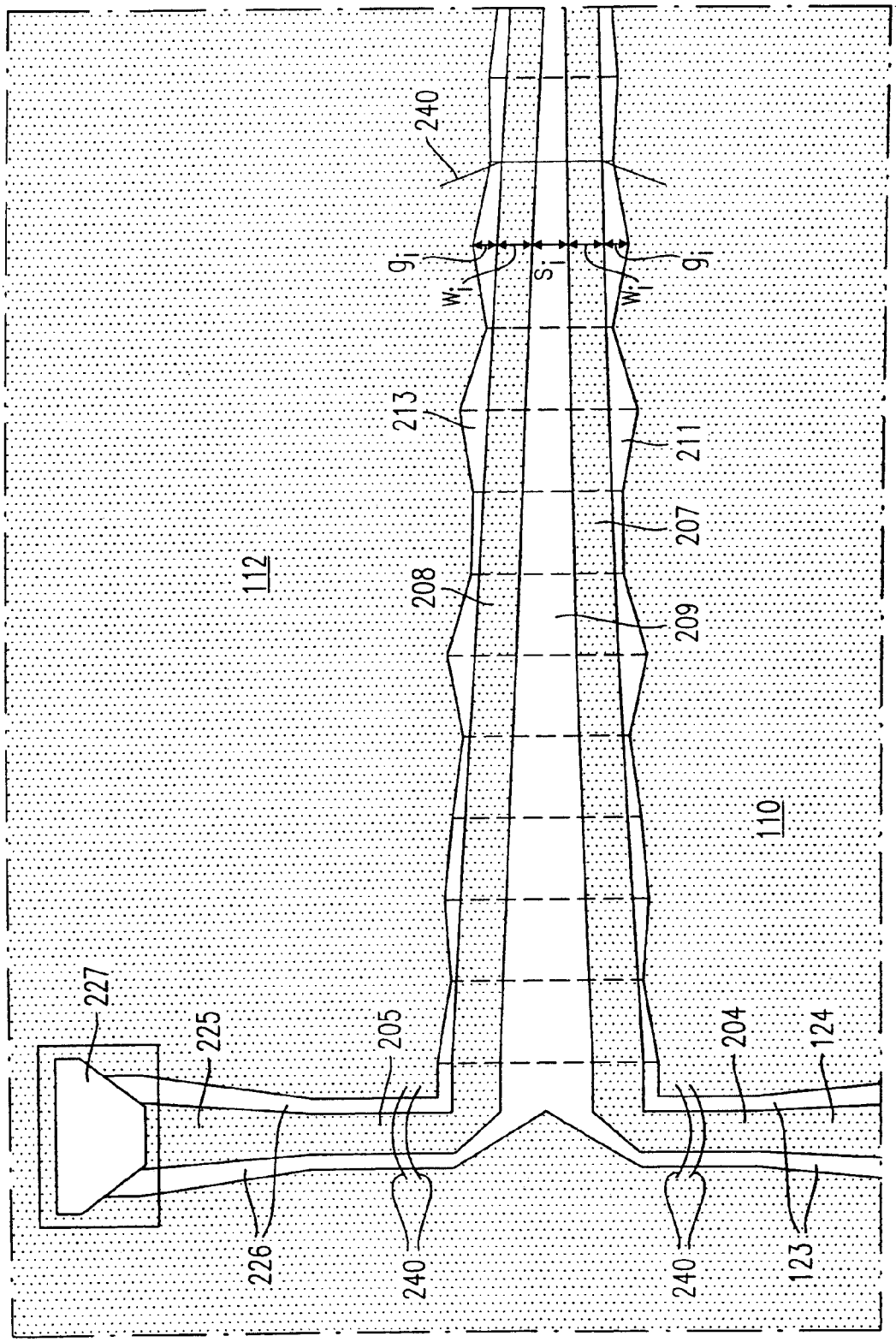
FIG. 5 shows an enlarged detail of a topology for the directional coupler according to the invention in coplanar waveguide technology in region V from FIG. 4.

FIG. 5 provides a detail, in a larger scale than FIG. 4 and slightly modified by comparison with FIG. 4, of the directional coupler unit 200 with the second connection 204, which is connected via the center conductor 124, with the adjacent gaps 123, to the second connection 104 of the first directional coupler unit 100, and the isolated termination 205, which is connected by the center conductor 225, with the adjacent gaps 226, to the absorber 227, in region V from FIG. 4. The drawing shows the gap 209 expanding exponentially in the direction towards the second connection 204 and/or the termination 205, with the gap width si between the two center conductors 207 and 208. Similarly, the diagram shows the width $w_i$ of the conductor track of the two center conductors 207 and/or 208 expanding in the direction towards the second connection 204 and/or the termination 205. Finally, the topological detail of FIG. 5 illustrates the "zig-zag" characteristic of the gap 211 with gap width $g_i$ between the center conductor 207 and the large-surface ground conductor 110 and the gap 213 between the center conductor 208 and the large-surface ground conductor 112 for the $i$-$^{th}$ coupler segment.

In order to avoid asymmetric field characteristics between the two pairs of conductors in a coplanar conductor system consisting in each case of one center conductor and one ground conductor, the two ground conductors are brought to an equal electrical potential via metallic connections.

Figure 6:
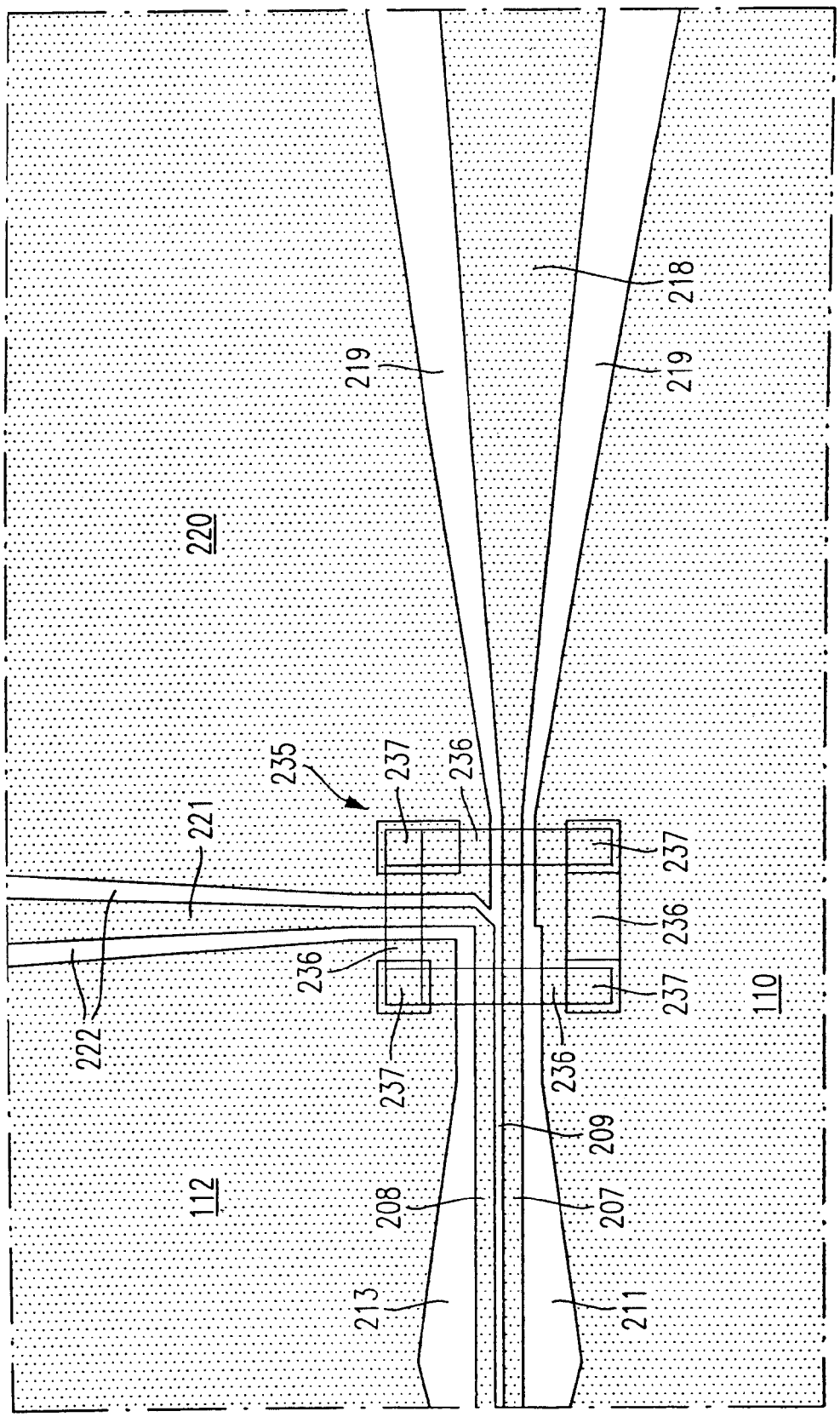
FIG. 6 shows an enlarged detail of a topology for the directional coupler according to the invention in coplanar waveguide technology in region VI from FIG. 4

For this purpose, as shown for the directional coupler unit 200 in FIG. 6, representing an enlarged detail of region VI from FIG. 4, so-called "air bridges" 235 are used in the region of narrow spacing between the individual ground conductors. These "air bridges" 235 consist of metallic layers 236, which extend, in an isolating manner with the insertion of a thin layer of air, across the region between the center conductors 207, 208, 218 and 221 and the gaps 211, 213, 219 and 222. In view of the short conductor length of the metallic layers 236, their inductance per unit length is comparatively low, and accordingly the high frequency behaviour of the coplanar waveguide is not impaired. The metallic layers 236 are connected to the large-surface ground conductors 110, 112 and 220 via posts 237, which are positioned in close proximity to the isolating gaps 211, 213, 219 and 222.

In the region of relatively wide spacing between the individual ground conductors, bonding wires 140 (for directional coupler unit 100) and 240 (for directional coupler unit 200) are used instead of the "air bridges", because, with relatively large conductor lengths, these provide a significantly lower capacitance per unit length by comparison with the "air bridges" 135 (for directional coupler unit 100) and 235 (for directional coupler unit 200).

Figure 7:
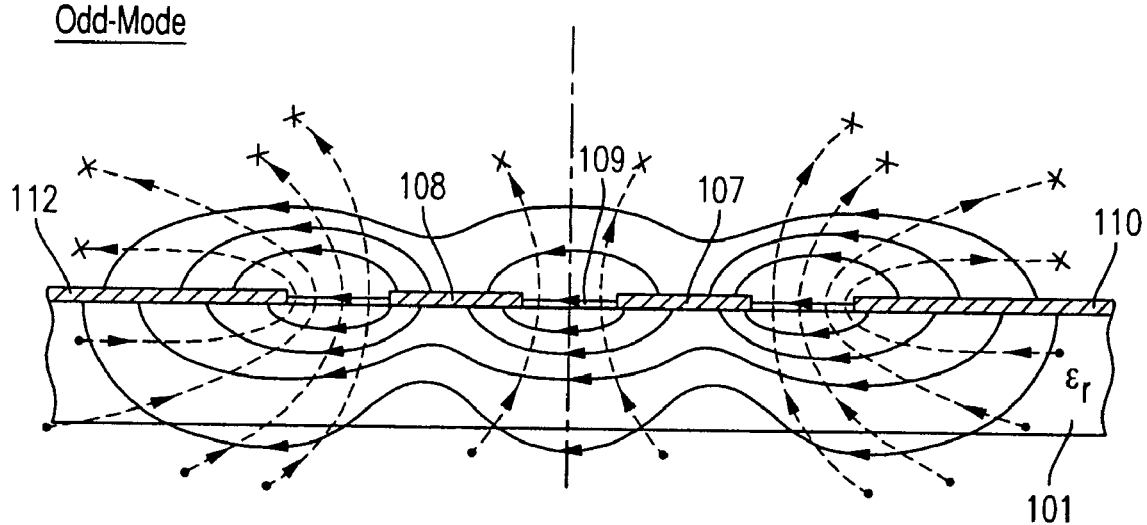
FIG. 7 shows a cross-sectional view of a coplanar directional coupler in coplanar waveguide technology with the field line characteristics for even-mode and odd-mode.
Figure 7:
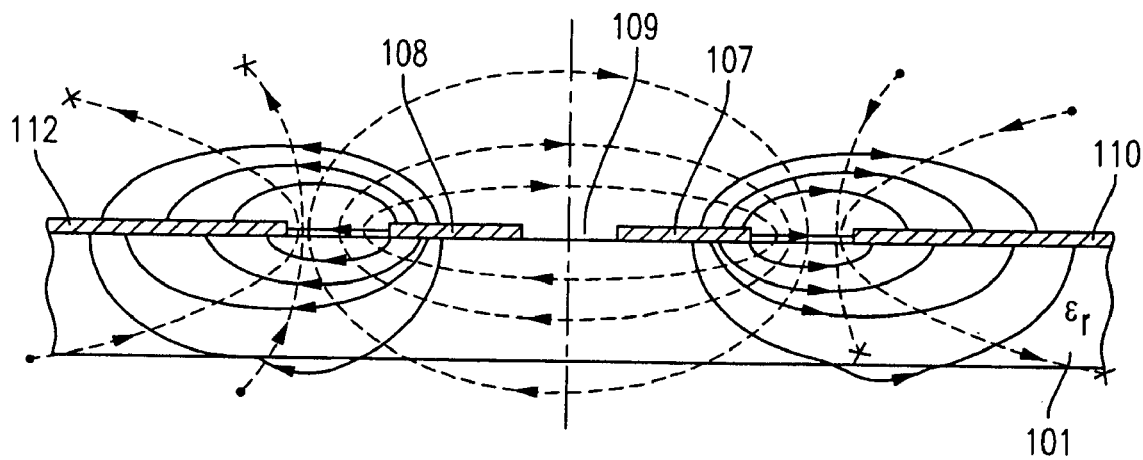

The method of functioning of the coupler section 102 in directional coupler unit 100 and/or the coupler section 202 in directional coupler unit 200 will be explained below with reference to the cross-sectional drawing of a coplanar waveguide system provided in FIG. 7 (the reference numbers for the individual conductors refer to the directional coupler unit 100):

If the coupler section 102 of the directional coupler unit 100 is excited at the first connection 103 with an electromagnetic wave of a given frequency and amplitude, then coupling processes will occur in the individual coupler segments between the center conductor 109 and the center conductor 108 of the coplanar conductor system. In FIG. 7, the electrical field lines associated with the electromagnetic wave are shown as continuous lines, and the magnetic field lines are shown as broken lines. The scale of the coupling process in the individual coupler segments is determined by the relevant coupling factor in that context, which, once again, is largely determined by the spacing between the two center conductors 107 and 108.

The superimposition of electromagnetic waves directly guided and coupled by the two pairs of conductors in the individual coupler segments i, which is characterised by a different intensity because of the different gap-spacing $s_i$ between the two center conductors 107 and 108, leads to two superimposed electromagnetic waves (modes) in each coupler segment i, namely an even-mode and an odd-mode. While the even-mode is characterised by an even electrical potential of the two center conductors 107 and 108, the odd-mode provides an odd electrical potential.

Specifying the gap geometry between the two center conductors 107 and 108 and between the center conductors 107 and the ground conductor 110 and/or between the center conductor 108 and the ground conductor 112, determines the cross-sectional division of dielectric/air and therefore also the effective permittivity coefficient $\epsilon_{(e)eff}$ and $\epsilon_{(o)eff}$ of the two modes, thereby also determining the phase velocities $v^{(e)}$ and $v^{(o)}$ of the even-mode and the odd-mode. Characteristically for directional couplers in coplanar technology with a geometry structure as described above, the adjustment of the phase velocity $v^{(o)}$ of the odd-mode through the gap geometry between the two center conductors is largely independent of the gap geometry between the two center conductors and their adjacent ground surfaces; and the adjustment of the phase velocity $v^{(e)}$ of the even-mode through the gap geometry between the two center conductors and their adjacent ground surfaces is independent of the gap geometry between the two center conductors. A more detailed explanation of this fact, which was determined numerically with the assistance of the simulation model, will not be provided in the context of the present description.

Figure 1:
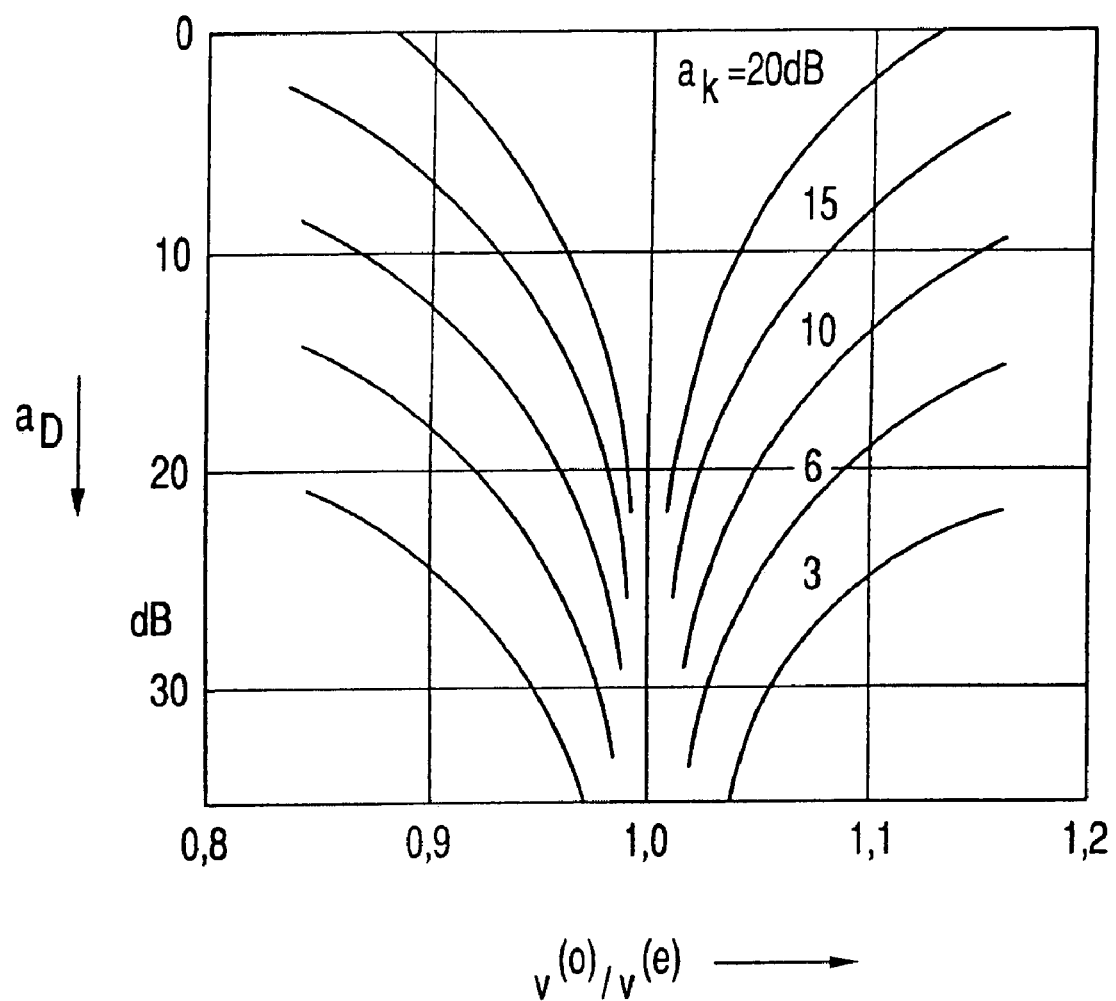
FIG. 1 shows a graphic representation of the correlation between directional loss $a_D$ and phase velocities $v^{(e)}$ and $v^{(o)}$ for the even-mode and odd-mode with different coupler losses $a_k$.
Figure 2:
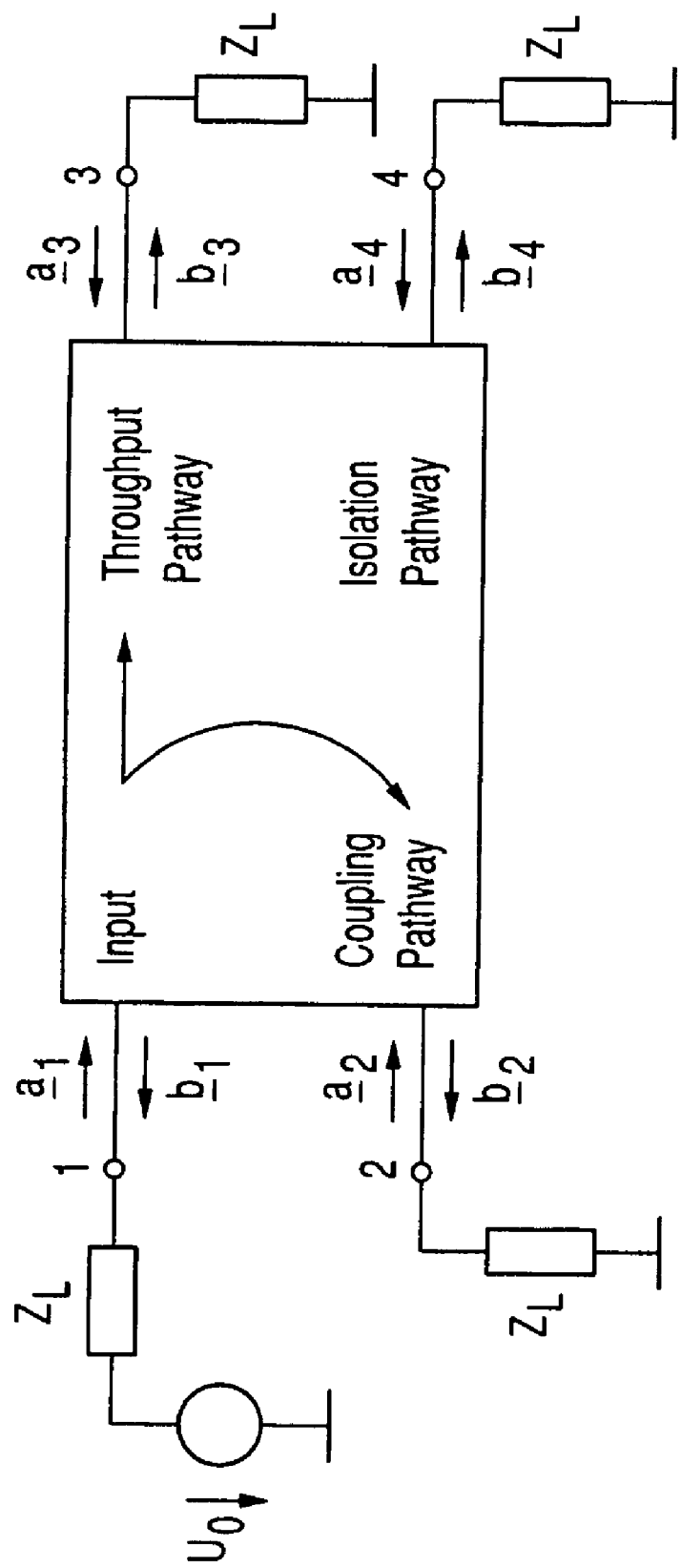
FIG. 2 shows a schematic block circuit diagram for a directional coupler.

The gap geometries between the two center conductors and between the two center conductors and their adjacent ground surfaces can be dimensioned using a simulation model in such a manner that the even-mode and the odd-mode fully compensate one another at the reflection-free termination 105, while the even-mode and odd-mode are added at the coupled connection 106. Accordingly, the high directivity $a_D$ ($a_D=-20*\lg(k) b_4/b_2$), see FIG. 2) required for a directional coupler is realised The coupling loss $a_k$ ($a_k=-20*\lg(k)$, $k=|b_2/a_1|$, see FIG. 2) in the region of the first connection 103 and/or the coupled connection 106 of e.g. 10 dB, as required for the directional coupler, is determined by the coupling factor k, which, once again, is dependent upon the characteristic impedance of the even-mode $Z_e$ and on the characteristic impedance of the odd-mode $Z_o$ and therefore also on the overall cross-sectional geometry of the coupler section 102.

The measures according to the invention therefore allow the realisation of an ultra-wideband, small and lightweight directional coupler. Experiments carried out by the applicant have shown that a ratio of maximum transmission frequency $f_{max}$ to minimum transmission frequency $f_{min}$ of $f_{max}/f_{min}=12$ can be achieved.

The invention is not restricted to the exemplary embodiment presented. Any of the features described may be combined with the other features in any manner required.

The invention claimed is:

1. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a supplied wave at the first connection, a termination, a first center conductor connecting the first connection and the second connection, a second center conductor connecting the coupled connection and the termination, and coplanar ground conductors bordering the outside of each of the center conductors, characterized in that
   the spacing between the two center conductors changes along the longitudinal extension of the center conductors over a coupler section, and
   the second connection of the first directional coupler unit is connected via a center conductor with two adjacent ground conductors to a second connection of a second directional coupler unit.

2. Directional coupler in coplanar waveguide technology according to claim 1, characterized in that
   the spacing between the center conductors increases exponentially in the direction from the first connection and/or from the coupled connection towards the second connection and/or towards the termination.

3. Directional coupler in coplanar wave guide technology comprising at least one first directional coupler unit with a first connection for feeding in or guiding out a wave, a second connection for feeding in or guiding out a wave supplied directly from or to the first connection, a coupled connection for coupling a fraction of a supplied wave at the first connection, a termination, a first center conductor connecting the first connection and the second connection, a second center conductor connecting the coupled connection and the termination and ground conductors bordering the outside of each of the center conductors, characterized in that
   the spacing in each case between a center conductor and an adjacent ground conductor changes along the longitudinal extension of the center conductor over a coupler section,
   the spacing between the two center conductors changes along the longitudinal extension of the center conductor over the coupler section, and
   the second connection of the first directional coupler unit is connected via a center conductor with two adjacent ground conductors to a second connection of a second directional coupler unit.

4. Directional coupler in coplanar waveguide technology according to claim 3, characterized in that
   the spacing in each case between a center conductor and an adjacent ground conductor increases or decreases in a linear manner between two adjacent coupler segments originally of constant width.

5. Directional coupler in coplanar waveguide technology according to claim 4, characterized in that
   the spacing in each case between a center conductor and an adjacent ground conductor lies above a predetermined lower limit value gMIN and below a predetermined upper limit value gMAX.

6. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a feeded wave at connection, a termination, a first center conductor connecting the first connection and the second connection, a second center conductor connecting the coupled connection and the termination, first and second external connections, and coplanar ground conductors bordering the outside of each of the center conductors, characterized in that the spacing between the two center conductors changes along the longitudinal extension of the center conductors over a coupler section, and tapers are provided at the transitions between the external connections and the center conductors, which continuously adapt the cross-sectional geometry of the coaxial feed lines to the cross-sectional geometry of the center conductors in order to minimize loss and reflection.

7. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a supplied wave at connection, a termination, a first center conductor connecting the first connection and the second connection, a second center conductor connecting the coupled connection and the termination and ground conductors bordering the outside of each of the center conductors, characterized in that the width of the conductor track of the two center conductors changes along the longitudinal extension of the center conductors over a coupler section, and a second directional coupler unit having a second connection, the second connection of the first directional coupler unit is connected via a center conductor with two adjacent ground conductors to a second connection of a second directional coupler unit.

8. Directional coupler in coplanar waveguide technology according to claim 7, characterized in that the width of the conductor track of the center conductors increases continuously in the direction from the first connection and/or from the coupled connection towards the second connection and/or the termination.

9. Directional coupler in coplanar waveguide technology according to claim 7, characterized in that the spacing between the two center conductors changes along the longitudinal extension of the center conductors over the coupler section.

10. Directional coupler in coplanar waveguide technology according to claim 8, characterized in that the spacing between the two center conductors changes along the longitudinal extension of the center conductors over the coupler section.

11. Directional coupler in coplanar waveguide technology according to claim 7, characterized in that the termination is terminated with a trapezoidal absorber.

12. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a feeded wave at connection, a termination, a first center conductor connecting the first connection and the second connection, a second center conductor connecting the coupled connection and the termination and ground conductors bordering the outside of each of the center conductors, and first and second external connections, characterized in that the spacing in each case between a center conductor and an adjacent ground conductor changes along the longitudinal extension of the center conductor over a coupler section, the spacing between the two center conductors changes along the longitudinal extension of the center conductor over the coupler sections, and tapers are provided at the transitions between the external connections and the center conductors, which continuously adapt the cross-sectional geometry of the coaxial feed lines to the cross-sectional geometry of the center conductors in order to minimize loss and reflection.

13. Directional coupler in coplanar waveguide technology according to claim 7, characterized in that the first and the second directional coupler unit are integrated monolithically in mirror image arrangement on a common substrate.

14. Directional coupler in coplanar waveguide technology according to claim 7, characterized in that, in the region of the narrowest spacing between the ground conductors, the ground conductors are connected via air bridges, and/or in regions of wider spacing between the ground conductors, the ground conductors are connected via bonding wires.

15. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a feeded wave at connection, a termination, a first center conductor connecting the first connection and the second connection, a second center conductor connecting the coupled connection and the termination and ground conductors bordering the outside of each of the center conductors, and first and second external connections, characterized in that the width of the conductor track of the two center conductors changes along the longitudinal extension of the center conductors over a coupler section, the width of the conductor track of the center conductors increases continuously in the direction from the first connection and/or from the coupled connection towards the second connection and/or the termination, and tapers are provided at the transitions between the external connections and the center conductors, which continuously adapt the cross-sectional geometry of the coaxial feed lines to the cross-sectional geometry of the center conductors in order to minimize loss and reflection.

16. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a supplied wave at connection, a termination, a first center conductor connecting the first connection and the second connection, a second center conductor connecting the coupled connection and the termination and ground conductors bordering the outside of each of the center conductors, and first and second external connections, characterized in that the width of the conductor track of the two center conductors changes along the longitudinal extension of the center conductors over a coupler section, and tapers are provided at the transitions between the external connections and the center conductors, which continuously adapt the cross-sectional geometry of the coaxial feed lines to the cross-sectional geometry of the center conductors in order to minimize loss and reflection.

17. Directional coupler in coplanar waveguide technology according to any one of claims 8 to 10, characterized in that the spacing in each case between a center conductor and an adjacent ground conductor changes along the longitudinal axis of the center conductors over the coupler section.

18. Directional coupler in coplanar waveguide technology according to any one of claims 1 to 5, characterized in that the termination is terminated with a trapezoidal absorber.

19. Directional coupler in coplanar waveguide technology according to claim 3, characterized in that the termination is terminated with a trapezoidal absorber.

20. Directional coupler in coplanar waveguide technology according to any one of claims 8 to 10, characterized in that the termination is terminated with a trapezoidal absorber.

21. Directional coupler in coplanar waveguide technology according to claim 3, characterized in that in the region of the narrowest spacing between the ground conductors, the ground conductors are connected via air bridges, and/or in regions of wider spacing between the ground conductors, the ground conductors are connected via bonding wires.

22. Directional coupler in coplanar waveguide technology according to any one of claims 8 to 13, characterized in that in the region of the narrowest spacing between the ground conductors, the ground conductors are connected via air bridges, and/or in regions of wider spacing between the ground conductors, the ground conductors are connected via bonding wires.

23. Directional coupler in coplanar waveguide technology comprising at least one first directional coupler unit with a first connection for feeding in or guiding out a wave, a second connection for feeding in or guiding out a wave supplied directly from or to the first connection, a coupled connection for coupling a fraction of a feeded wave at connection, a termination, a first center conductor connecting the first connection and the second connection, a second center conductor connecting the coupled connection and the termination and ground conductors bordering the outside of each of the center conductors, characterized in that the width of the conductor track of the two center conductors changes along the longitudinal extension of the center conductors over a coupler section, the width of the conductor track of the center conductors increases continuously in the direction from the first connection and/or from the coupled connection towards the second connection and/or the termination, and the second connection of the first directional coupler unit is connected via a center conductor with two adjacent ground conductors to a second connection of a second directional coupler unit.

24. Directional coupler in coplanar waveguide technology according to any one of claims 1 to 5, characterized in that in the region of the narrowest spacing between the ground conductors, the ground conductors are connected via air bridges, and/or in regions of wider spacing between the ground conductors, the ground conductors are connected via bonding wires.

* * * * *